US00RE50145E

(19) United States
(12) Reissued Patent
Liu

(10) Patent Number: US RE50,145 E
(45) Date of Reissued Patent: Sep. 24, 2024

(54) ARRAY SUBSTRATE AND MANUFACTURING METHOD THEREOF, DISPLAY PANEL AND DISPLAY DEVICE

(71) Applicant: BOE Technology Group Co., Ltd., Beijing (CN)

(72) Inventor: Wei Liu, Beijing (CN)

(73) Assignee: BOE Technology Group Co., Ltd., Beijing (CN)

(21) Appl. No.: 17/839,488

(22) Filed: Jun. 14, 2022

Related U.S. Patent Documents

Reissue of:
(64) Patent No.: 10,811,434
Issued: Oct. 20, 2020
Appl. No.: 15/761,391
PCT Filed: Sep. 27, 2017
PCT No.: PCT/CN2017/103640
§ 371 (c)(1),
(2) Date: Mar. 19, 2018
PCT Pub. No.: WO2018/153089
PCT Pub. Date: Aug. 30, 2018

(30) Foreign Application Priority Data

Feb. 22, 2017 (CN) ..... 201710098499.8

(51) Int. Cl.
*H01L 21/00* (2006.01)
*H01L 27/12* (2006.01)
(Continued)

(52) U.S. Cl.
CPC ..... *H01L 27/1218* (2013.01); *H01L 27/1225* (2013.01); *H01L 27/1248* (2013.01);
(Continued)

(58) Field of Classification Search
CPC ..... H01L 27/1218; H01L 27/1248; H01L 29/78633; H01L 27/1288; H01L 27/1225;
(Continued)

(56) References Cited

U.S. PATENT DOCUMENTS 7,355,202 B2 * 4/2008 Zhang ..... H01L 27/1214 257/66
10,211,264 B2 * 2/2019 Lee ..... H01L 51/5209
(Continued)

FOREIGN PATENT DOCUMENTS

CN 101957530 A 1/2011
CN 104393000 A 3/2015
(Continued)

OTHER PUBLICATIONS

Translation of CN104637955 (Year: 2015).*
(Continued)

*Primary Examiner* — Ling X Xu
(74) *Attorney, Agent, or Firm* — Intellectual Valley Law, P.C.

(57) ABSTRACT

An array substrate and a manufacturing method thereof, a display panel and display device relating to display technology are provided. The array substrate includes: a substrate; a light shielding layer being of electrical conductive over the substrate; a buffer layer over the light shielding layer; an active layer insulated from the light shielding layer by the buffer layer and shielded by the light shielding layer against light radiation; a gate insulating layer disposed over the active layer; and a patterned first electrode layer having a first electrode over the gate insulating layer, the first electrode being a gate electrode; wherein the patterned first electrode layer further comprises a second electrode over the buffer layer, the second electrode having at least a portion in contact with the buffer layer. The buffer layer comprises a first via-hole, and the second electrode is in electrical connection with the light shielding layer through the first via-hole.

20 Claims, 10 Drawing Sheets

(51) Int. Cl.

| | |
|---|---|
| ***H10K 59/126*** | (2023.01) |
| ***H10K 59/131*** | (2023.01) |
| ***H10K 71/00*** | (2023.01) |
| *G02F 1/1362* | (2006.01) |
| *G02F 1/1368* | (2006.01) |
| *H10K 59/12* | (2023.01) |
| *H10K 102/10* | (2023.01) |

(52) U.S. Cl.
CPC ..... *H01L 27/1288* (2013.01); *H10K 59/126* (2023.02); *H10K 59/131* (2023.02); *H10K 71/00* (2023.02); *G02F 1/136209* (2013.01); *G02F 1/1368* (2013.01); *G02F 1/13685* (2021.01); *G02F 2201/123* (2013.01); *H10K 59/1201* (2023.02); *H10K 2102/103* (2023.02)

(58) Field of Classification Search
CPC ..... H01L 29/66969; H01L 29/7869; H10K 59/131; H10K 59/126; H10K 71/00; H10K 59/1201; H10K 2102/103; G02F 2201/123; G02F 1/136209; G02F 1/1368; G02F 1/13685
See application file for complete search history.

(56) References Cited

U.S. PATENT DOCUMENTS

| | | | |
|---|---|---|---|
| 2013/0264575 | A1 | 10/2013 | Liu |
| 2015/0187959 | A1 | 7/2015 | Yoon |
| 2016/0049426 | A1 | 2/2016 | Lim et al. |
| 2016/0126258 | A1 | 5/2016 | Liu et al. |
| 2016/0163769 | A1 | 6/2016 | Lee et al. |

FOREIGN PATENT DOCUMENTS

| | | | |
|---|---|---|---|
| CN | 104538399 | A | 4/2015 |
| CN | 104637955 | A | 5/2015 |
| CN | 105374845 | A | 3/2016 |
| CN | 105489614 | A | 4/2016 |
| CN | 105679791 | A | 6/2016 |

OTHER PUBLICATIONS

International Search Report & Written Opinion mailed Jan. 9, 2018, regarding PCT/CN2017/103640.

First Office Action in the Chinese Patent Application No. 201710098499.8, dated Sep. 21, 2020; English translation attached.

Non-Final Office Action in the U.S. Appl. No. 15/761,391, dated May 26, 2020.

Response to Non-Final Office Action in the U.S. Appl. No. 15/761,391, dated Jun. 4, 2020.

Notice of Allowance in the U.S. Appl. No. 15/761,391, dated Jul. 10, 2020.

First Office Action in the Chinese Patent Application No. 201710098499.8, dated Mar. 23, 2020; English translation attached.

* cited by examiner

ARRAY SUBSTRATE AND MANUFACTURING METHOD THEREOF, DISPLAY PANEL AND DISPLAY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application is a *reissue of U.S. Pat. No. 10,811,434B2, issued Oct. 20, 2020, which is the* national stage application under 35 U.S.C. § 371 of International Application No. PCT/CN2017/103640, filed Sep. 27, 2017, which claims priority of the Chinese Patent Application No. 201710098499.8, entitled "ARRAY SUBSTRATE AND MANUFACTURING METHOD THEREOF, DISPLAY PANEL AND DISPLAY DEVICE" filed on Feb. 22, 2017, the disclosure of which is incorporated herein by reference in its entirety.

FIELD

The present disclosure relates to display technology, in particular but not limited to an array substrate and a manufacturing method thereof, a display panel and display device.

BACKGROUND

Compared with conventional back-channel-etching (BCE) type and etch-stop-layer (ESL) type thin film transistors, oxide based thin film transistors with top-gate structure have the following advantages: the parasitic capacitance is significantly reduced, thus achieving good driving performance: the size of each pixel is able to be reduced so as to meet the high-resolution display requirements; the thickness of gate insulating layer can be reduced, which is beneficial to further reduce overall manufacturing thickness; and the more stable electrical characteristics of thin film transistors can be achieved, thereby improving the reliability of the display panel.

However, there are many restrictions on the design requirements of process in producing a backplate using oxide based thin film transistors with top-gate structure. For example, the top-gate structure in the channel region is susceptible to the light coming from below, thereby degrading the electrical characteristics of thin film transistors, and thus a light shielding layer is needed. In addition, in order to improve the electrical characteristics of oxide based thin film transistors with top-gate structure, the voltage is usually applied on both the top gate and metal of the light shielding layer. This is similar to a double channel structure with upper and lower channels. This has led to a more complicated hole etching process, an increase in the risk of bad backplate, and a raise in the difficulty of the overall process.

SUMMARY

In a first aspect, an array substrate is provided. The array substrate includes: a substrate; a light shielding layer being of electrical conductive over the substrate; a buffer layer over the light shielding layer: an active layer insulated from the light shielding layer by the buffer layer and shielded by the light shielding layer against light radiation: a gate insulating layer disposed over the active layer: and a patterned first electrode layer having a first electrode over the gate insulating layer, the first electrode being a gate electrode; wherein the patterned first electrode layer further comprises a second electrode over the buffer layer, the second electrode having at least a portion in contact with the buffer layer. The buffer layer comprises a first via-hole, and the second electrode is in electrical connection with the light shielding layer through the first via-hole.

In one or more embodiments, the array substrate may further include a gate line in a same layer with the light shielding layer.

In one or more embodiments, the buffer layer further comprises a second via-hole, and the gate line is in electrical connection with the gate electrode through the second via-hole.

In one or more embodiments, the second electrode is a source electrode.

In one or more embodiments, the patterned first electrode layer further comprises a third electrode which is a drain electrode.

In one or more embodiments, the array substrate further comprises a passivation layer and a second electrode layer over the patterned first electrode layer; the passivation layer comprises a third via-hole adjacent to the second via-hole, and a fourth via-hole through which the second electrode layer is connected to the gate electrode; and the second electrode layer is connected to the gate line through the second via-hole and the third via-hole.

In one or more embodiments, the second electrode layer comprises a transparent electrode, the transparent conductive electrode comprising one or a combination selected from a group consisting of: a pixel electrode, a common electrode and an anode.

In one or more embodiments, the array substrate further includes a first connecting electrode connected to the gate line through the second via-hole, and a second connecting electrode connected to the first connecting electrode through the third via-hole and connected to the gate electrode through the fourth via-hole.

In one or more embodiments, the active layer includes a first portion in contact with the second electrode, the first portion being treated to be conductive.

In one or more embodiments, the active layer further includes a second portion not covered by the gate insulating layer or the second electrode, the second portion being treated to be conductive.

In one or more embodiments, the patterned first electrode layer comprises pure copper.

In one or more embodiments, the active layer comprises at least one or a combination of materials selected from a group consisting of: indium gallium zinc oxide, indium zinc oxide, zinc oxide and gallium oxide zinc.

In a second aspect, a display panel is provided, where the display panel comprises the above array substrate.

In a third aspect, a method of manufacturing an array substrate is provided. The method may include: forming a light shielding layer of electrical conductive material over a substrate; forming a buffer layer over the substrate having the light shielding layer formed thereon; forming an active layer and a gate insulating layer sequentially over the buffer layer, the active layer being insulated from the light shielding layer by the buffer layer and shielded by the light shielding layer against light radiation; and forming a patterned first electrode layer having a first electrode over the gate insulating layer, the first electrode being a gate electrode; wherein the patterned first electrode layer further comprises a second electrode over the buffer layer, the second electrode having at least a portion in contact with the buffer layer. The buffer layer comprises a first via-hole, the second electrode is in electrical connection with the light shielding layer through the first via-hole.

In one or more embodiments, the method may further include forming a gate line in a same layer with the light shielding layer.

In one or more embodiments, the buffer layer further comprises a second via-hole, and the gate line is in electrical connection with the gate electrode through the second via-hole.

In one or more embodiments, the second electrode is a source electrode; and the patterned first electrode layer further comprises a third electrode which is a drain electrode.

In one or more embodiments, the method may further include: forming a passivation layer and a second electrode layer. The passivation layer comprises a third via-hole adjacent to the second via-hole, and a fourth via-hole through which the second electrode layer is connected to the gate electrode. The second electrode layer is connected to the gate line through the second via-hole and the third via-hole.

In one or more embodiments, the step of forming the active layer and the gate insulating layer comprises: sequentially forming a semiconductor film and a gate insulating film. and forming photoresist on the gate insulating film; subjecting the photoresist to exposure using a half tone mask, thereby forming a photoresist fully-reserved portion, a photoresist half-reserved portion and a photoresist fully-removed portion after development. The photoresist fully-reserved portion corresponding to the gate insulating layer to be formed, the photoresist half-reserved portion corresponding to a portion of the active layer to be formed that is not covered by the gate insulating layer; the photoresist fully-removed portion corresponding to other portions.

In one or more embodiments, the step of forming the active layer and the gate insulating layer further comprises: etching the gate insulating film and the semiconductor film that are correspond to the photoresist fully-removed portion by dry etching and wet etching process; removing the photoresist half-reserved portion by ashing process: etching the exposed gate insulating film by thy etching process to form the gate insulating layer; and treating the portion of active layer that is not covered by the gate insulating layer to be conductive with plasma.

In one or more embodiments, the step of forming the patterned first electrode layer comprises: forming a metal conductive film on the substrate having the active layer and the gate insulating layer formed thereon; forming a photoresist layer, wherein etching selectivity ratio of the metal conductive film to the active layer is greater than or equal to 10:1; subjecting the photoresist layer to exposure using a mask, thereby forming a photoresist fully-reserved portion and a photoresist fully-removed portion after development: and etching the metal conductive film by wet etching process to form the patterned first electrode layer.

In one or more embodiments, prior to the forming of the patterned first electrode layer, the orthographic projection of the gate electrode to be formed on the substrate is completely covered by the orthographic projection of the gate insulating layer on the substrate, and the size of the gate insulating layer is greater than that of the gate electrode to be formed. The method further comprises etching the gate insulating layer by thy etching process after etching the metal conductive film by wet etching process and before removing the photoresist fully-reserved portion.

In one or more embodiments, etching of the gate insulating layer exposes a second portion of the active layer; where the method further comprises treating the second portion of the active layer to be conductive with plasma.

In one or more embodiments, the first via-hole and the second via-hole are formed by dry etching process.

BRIEF DESCRIPTION OF THE DRAWINGS

In order to illustrate embodiments of present disclosure or the technical solutions of other implementations more clearly, the drawings according to embodiments of the present disclosure will be introduced briefly below.

DETAILED DESCRIPTION OF EMBODIMENTS

In order to make those skilled in the art understand the technical solutions of present disclosure better, the present disclosure is further elaborated in combination with the accompanying drawings and some embodiments below.

As shown in FIG. 1A to FIG. 1F, a method comprising six patterning processes is commonly used to prepare an oxide based thin film transistor backplate with top-gate structure. Specifically, the method comprises the following steps.

Figure 1A:
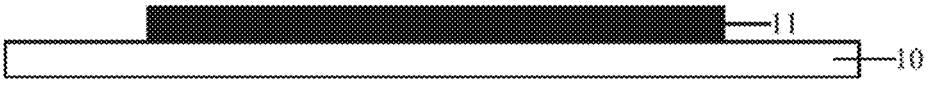
FIG. 1A is a schematic view illustrating a step in the process of manufacturing an oxide based thin film transistor backplate with top-gate structure provided in some embodiments.

S10: as shown in FIG. 1A, a light shielding layer 11 is formed on a substrate 10 by a patterning process.

The light shielding layer 11 herein is made of metal conductive material with light shielding effect. The processes of film forming, masking, exposure, developing, etching, peeling and the like may be included in each patterning process, respectively.

Figure 1B:
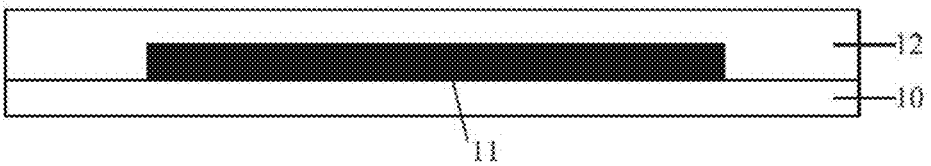
FIG. 1B is a schematic view illustrating a step in the process of manufacturing an oxide based thin film transistor backplate with top-gate structure provided in some embodiments.

S11: as shown in FIG. 1B, a buffer layer 12 is formed on the structure of S10.

Figure 1C:
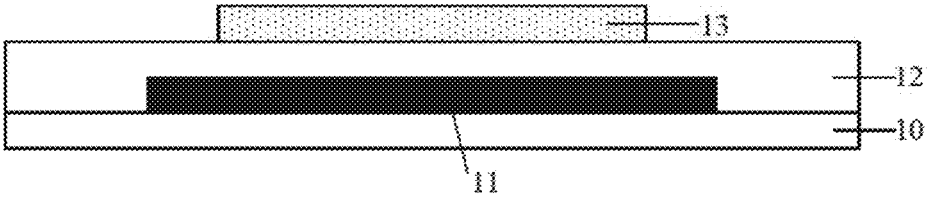
FIG. 1C is a schematic view illustrating a step in the process of manufacturing an oxide based thin film transistor backplate with top-gate structure provided in some embodiments.

S12: as shown in FIG. 1C, an oxide active layer 13 is formed by a patterning process on the structure of S11, and is shielded by the light shielding layer 11 against light radiation.

Figure 1D:
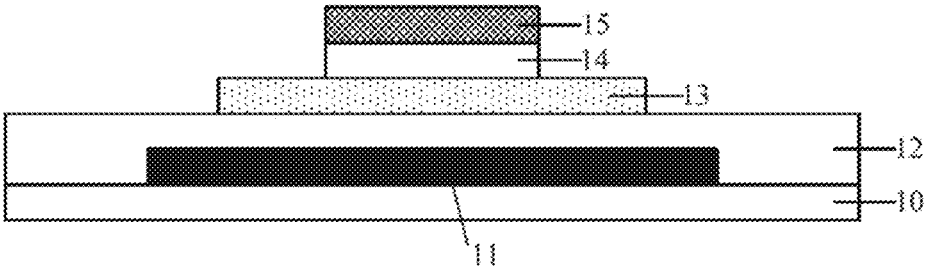
FIG. 1D is a schematic view illustrating a second step in the process of manufacturing an oxide based thin film transistor backplate with top-gate structure provided in some embodiments.

S13: as shown in FIG. 1D, a gate insulating layer 14 and a gate 15 are formed by a patterning process on the structure of S12.

Figure 1E:
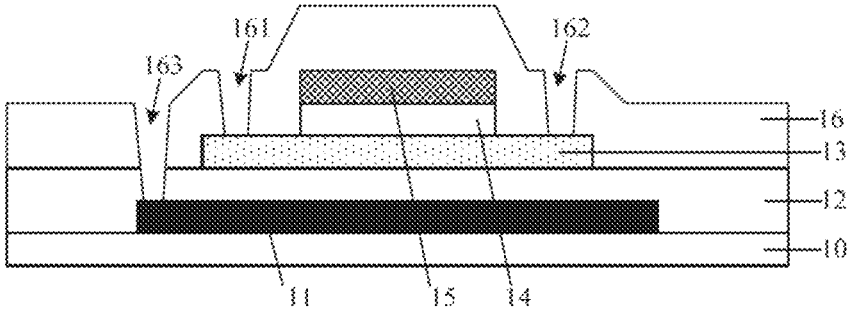
FIG. 1E is a schematic view illustrating a step in the process of manufacturing an oxide based thin film transistor backplate with top-gate structure provided in some embodiments.

S14: as shown in FIG. 1E, an insulating interlayer 16 is formed by a patterning process on the structure of S13. The insulating interlayer 16 comprises a fifth via-hole 161 and a sixth via-hole 162, via which the oxide active layer 13 is exposed at this stage.

Figure 1F:
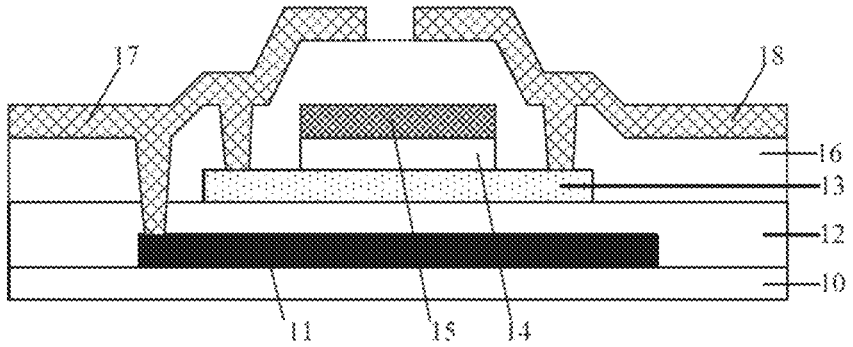
FIG. 1F is a schematic view illustrating a second step in the process of manufacturing an oxide based thin film transistor backplate with top-gate structure provided in some embodiments.

S15: as shown in FIG. 1F, a source 17 and a drain 18 are formed by a patterning process on the structure of S14: the source 17 is in contact with the oxide active layer 13 through the fifth via-hole 161 and in contact with the light shielding layer 11 through a seventh via-hole 163: and the drain 18 is in contact with the oxide active layer 13 through the sixth via-hole 162.

In order to improve the electrical characteristics of thin film transistors, the seventh via-hole 163, via which the light shielding layer 11 is exposed in FIG. 1E, may also be formed on both the insulating interlayer 16 and the buffer layer 12 in the process of S14. Thus, the source 17 is allowed to be in electrical connection with the light shielding layer 11 through the seventh via-hole 163, thereby providing voltage to the light shielding layer 11.

Figure 2:
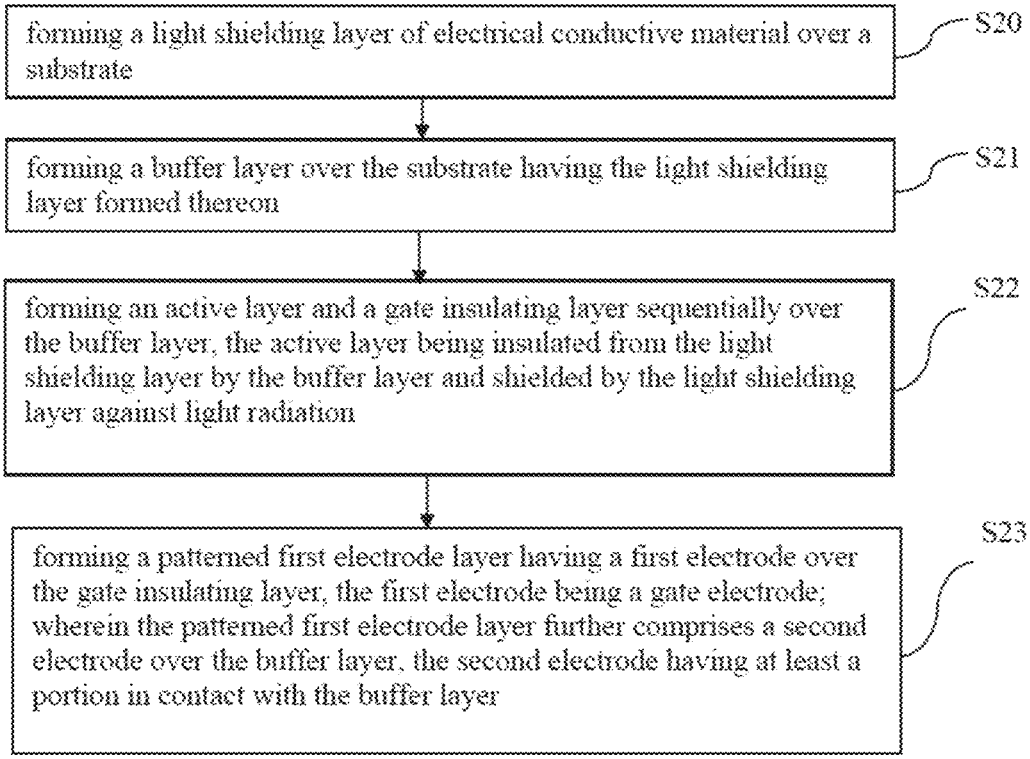
FIG. 2 is a schematic view illustrating the process of manufacturing an array substrate according to some embodiments of the present disclosure.

As shown in FIG. 2, a method of manufacturing an array substrate is provided according to some embodiments of the present disclosure. The manufacturing method comprises following steps.

Figure 3A:
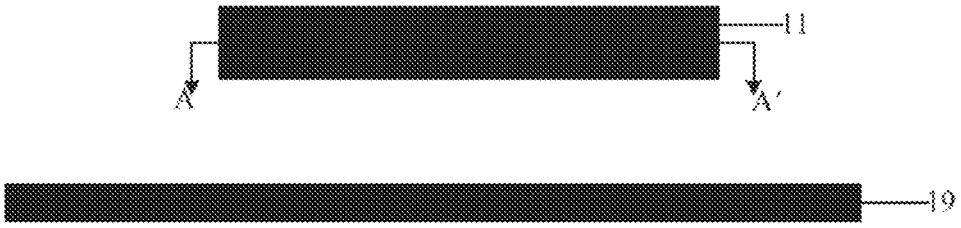
FIG. 3A is a top plan view showing the formation of a light shielding layer and a gate line according to embodiments of the present disclosure.
Figure 3B:
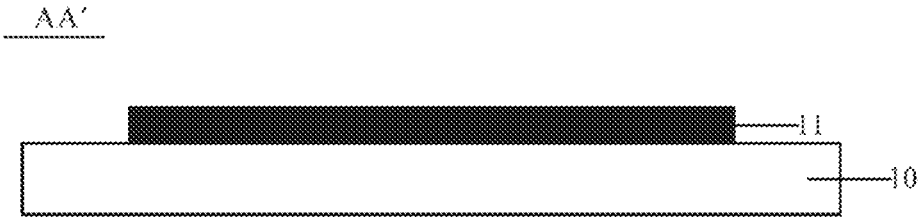
FIG. 3B is a section view of FIG. 3A in the AA' direction.

S20: a light shielding layer 11 being of electrical conductive and a gate line 19 on a substrate 10 is formed by a patterning process as shown in FIG. 3A and FIG. 3B. The light shielding layer 11 may be made of metals.

Figure 4A:
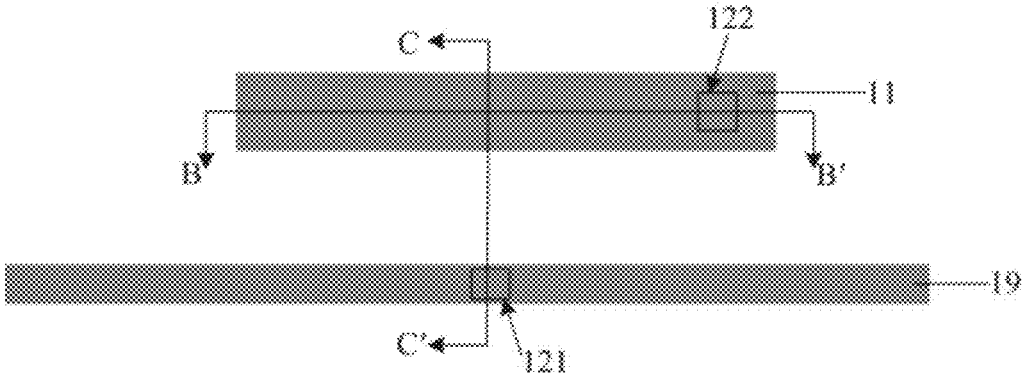
FIG. 4A is a top plan view showing the formation of a buffer layer on the structure of FIG. 3A.
Figure 4B:
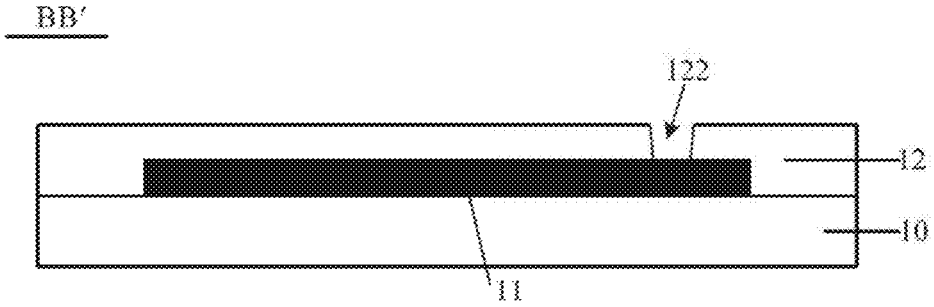
FIG. 4B is a section view of FIG. 4A in the BB' direction.
Figure 4C:
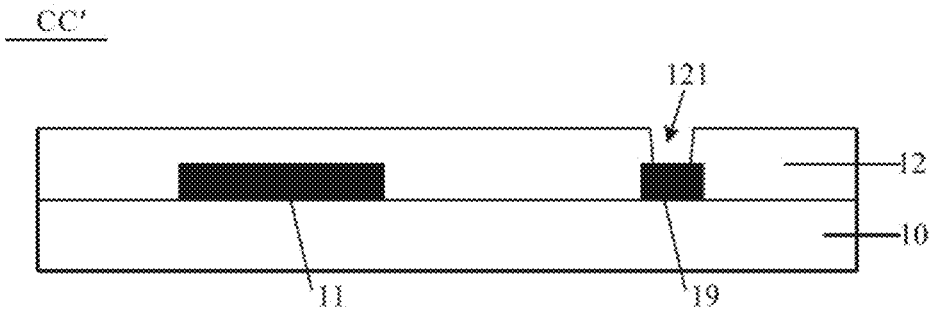
FIG. 4C is a section view of FIG. 4A in the CC' direction.

S21: a buffer layer 12 is formed by a patterning process on the substrate 10 having the light shielding layer 11 and the gate line 19 formed thereon as shown in FIG. 4A, FIG. 4B and FIG. 4C, the buffer layer 12 comprising a first via-hole 122 and a second via-hole 121. The gate line 19 is exposed through the second via-hole 121 and the light shielding layer 11 is exposed through the first via-hole 122. The effects achieved by the two via-holes would be described later.

The buffer layer 12 may be a single layer or have a multilayer structure. The buffer layer 12 provides a more stable bonding between the oxide active layer 13 and the substrate 10 and prevents harmful impurities and ions in the substrate 10 from spreading to the oxide active layer 13.

For example, when the buffer layer 12 is a single layer, the buffer layer 12 may be made of materials such as silicon oxide (SiOx) or silicon nitride (SiNx). When the buffer layer 12 is of two or more layers, it may be a composite film of the silicon oxide layer and the silicon nitride layer.

Figure 5A:
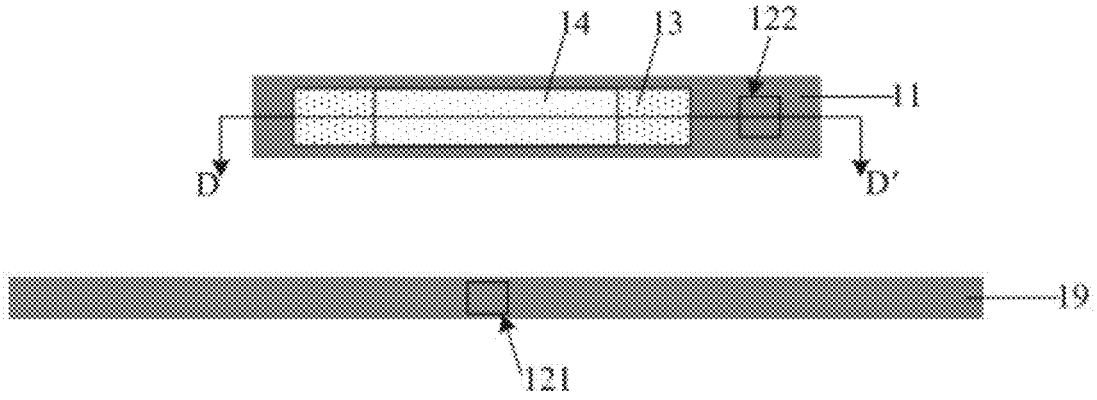
FIG. 5A is a top plan view showing the formation of an oxide active layer and a gate insulating layer on the structure of FIG. 4A.
Figure 5B:
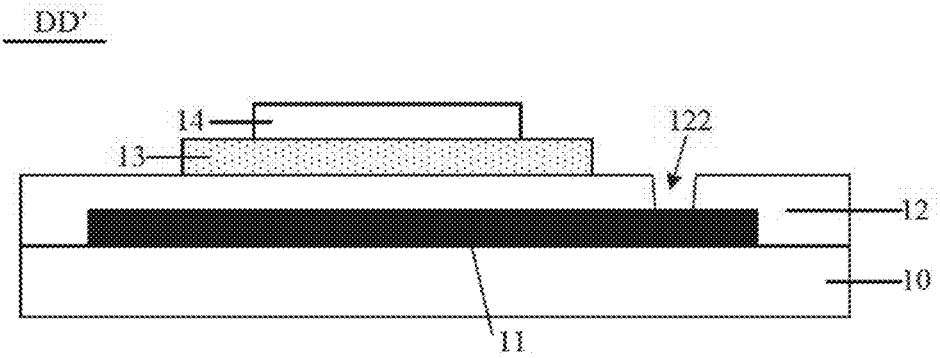
FIG. 5B is a section view of FIG. 5A in the DD' direction.

S22: an oxide active layer 13 and a gate insulating layer 14 are formed by a patterning process over the buffer layer 12 as shown in FIG. 5A and FIG. 5B.

In addition, the oxide active layer 13 is provided between the gate insulating layer 14 and the buffer layer 12. The orthographic projection of the oxide active layer 13 on the substrate 10 is covered by the orthographic projection of the light shielding layer 11 on the substrate 10. That is, the oxide active layer 13 is completely within the area of the light shielding layer 11 viewed from the top of the array structure as shown in FIG. 5A.

Figure 6A:
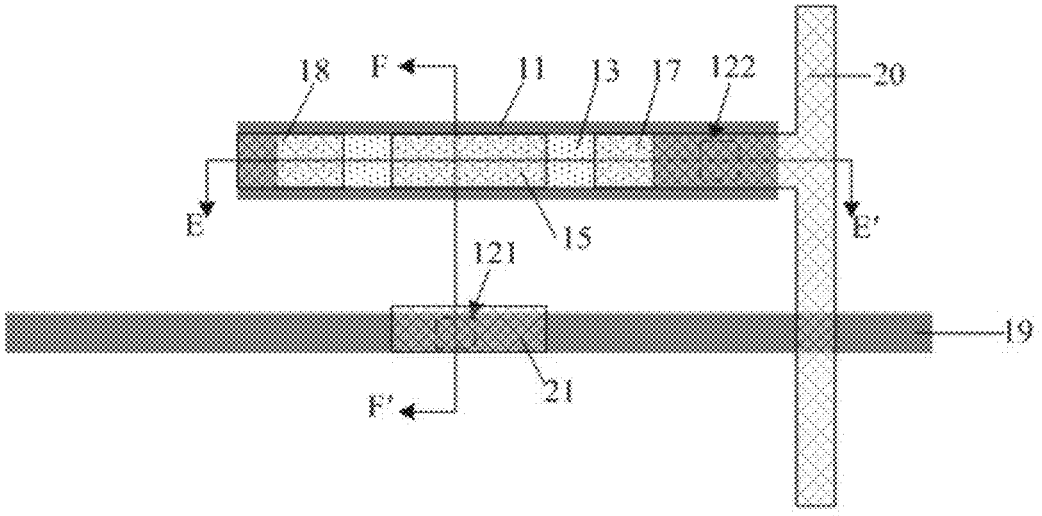
FIG. 6A is a top plan view showing the formation of a patterned first electrode layer on the structure of FIG. 5A.
Figure 6B:
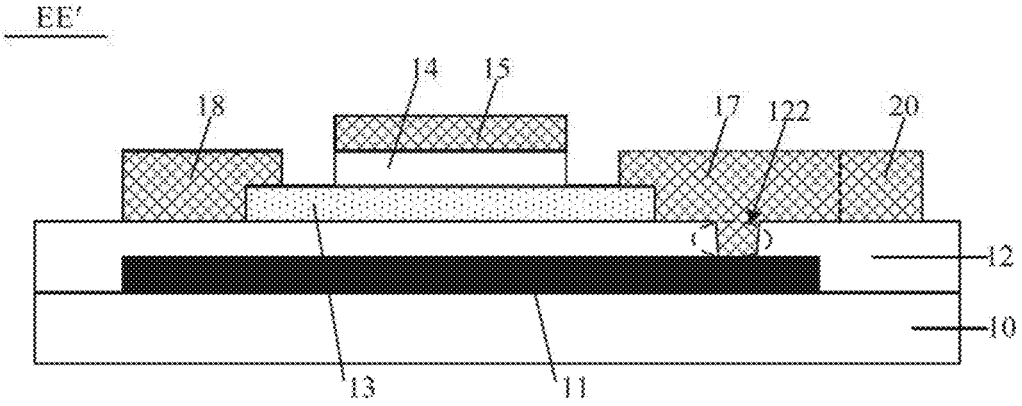
FIG. 6B is a section view FIG. 6A in the EE' direction.
Figure 6C:
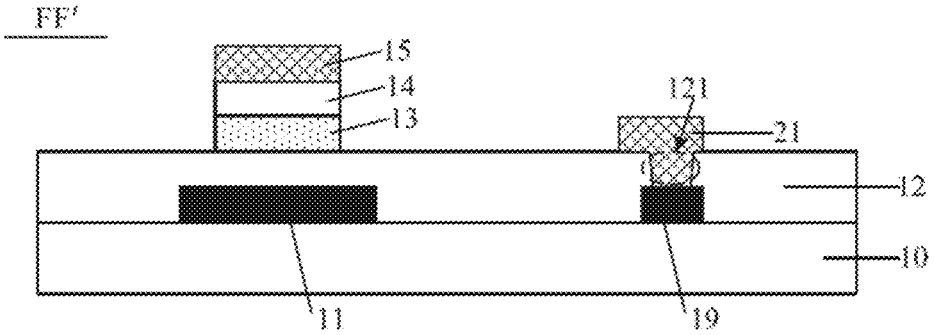
FIG. 6C is a section view of FIG. 6A in the FF' direction.

S23: as shown in FIG. 6A, FIG. 6B and FIG. 6C, a patterned first electrode layer is formed by a patterning process on the substrate having the oxide active layer 13 and the gate insulating layer 14 formed thereon, wherein the patterned first electrode layer may comprise a gate 15, a source 17, a drain 18, a first connecting electrode 21 and a data line 20 connected with the source 17. The first connecting electrode 21 is insulated from (i.e. not in direct connection with) the gate 15, the source 17, the drain 18 and the data line 20, and the first connecting electrode 21 is electrically connected with the gate line 19 through the second via-hole 121; the source 17 and the drain 18 are in direct contact with the oxide active layer 13, and the source 17 is also electrically connected with the light shielding layer 11 through the first via-hole 122.

At this stage of the manufacturing process, the first connecting electrode 21 is insulated from the gate 15, the source 17, the drain 18 and the data line 20 since the first connecting electrode 21 is physically separated from the gate 15, the source 17, the drain 18 and the data line 20. However, at a later stage since the gate 15 and the gate line 19 must be electrically connected, the first connection electrode 21 is required to be electrically connected to the gate line 19, for example, through a second connection electrode or a second wire.

The second via-hole 121 of the buffer layer 12 is used to electrically connect the first connecting electrode 21 to the gate line 19, achieving the electrical connection between the gate 15 and the gate line 19.

The first via-hole 122 is used to electrically connect the source 17 to the light shielding layer 11. Accordingly, the position of the second via-hole 122 may be set to correspond to a portion of the source 17 which is not overlap with the oxide active layer 13.

The light shielding layer 11, the buffer layer 12, the oxide active layer 13, the gate insulating layer 14, the gate 15, the source 17 and the drain 18 sequentially formed on the substrate 10 make up the oxide based thin film transistors with top-gate structure.

The source 17 and the drain 18 of thin film transistors in some embodiments of the present disclosure are symmetric, so there is no difference between the source 17 and the drain 18. To distinguish these two electrodes of the thin film transistor besides the gate 15, one of them is called the source 17 and the other is called the drain 18, or the source electrode 17 and the drain electrode 18. The gate 15 may also be called the gate electrode 15.

A method of manufacturing an array substrate is provided according to embodiments of present disclosure. The method may comprise forming the light shielding layer 11 of electrical conductive material over the substrate 10; forming a buffer layer 12 over the substrate 10 having the light shielding layer 11 formed thereon; forming an active layer 13 and a gate insulating layer 14 sequentially over the buffer layer 12, the active layer 13 being insulated from the light shielding layer 11 by the buffer layer 12 and shielded by the light shielding layer 11 against light radiation; and forming a patterned first electrode layer having a gate electrode 15 (i.e. a first electrode) over the gate insulating layer 14. The patterned first electrode layer further comprises the source electrode 17 (i.e. a second electrode) over the buffer layer 12, the source electrode 17 having at least a portion in contact with the buffer layer 12. The buffer layer 12 comprises a first via-hole 122 and the source electrode 17 is in electrical connection with the light shielding layer 11 through the first via-hole 122. The buffer layer 12 further comprises the second via-hole 121, and the gate line 19 is in electrical connection with the gate electrode 15 through the second via-hole 121. The patterned first electrode layer further comprises the drain electrode 18 (i.e. a third electrode). In addition, the gate line 19 may be formed at the same step of forming the light shielding layer 11.

Since only a buffer layer 12 is provided between the first connecting electrode 21 and the gate line 19, the first connecting electrode 21 and the gate line 19 may be electrically connected only by the second via-hole 121 formed on the buffer layer 12. At the same time, since the source 17 and drain 18 are lapped directly with the oxide active layer 13, the first via-hole 122 corresponds to the portion of the source 17 that is not overlap with the oxide active layer 13, thereby achieving an electrical connection between the source 17 and the light shielding layer 11 through the second via-hole 122 formed on the buffer layer 12. Accordingly, compared with other methods which need to etch through two layers to achieve the electrical connection between the source and the light shielding layer, the occurrence of poor etching of via-holes is reduced according to the embodiments of the present disclosure, and thus the undesirable incidence of manufacturing the array substrate is reduced. In addition, the array substrate prepared by the embodiments of the present disclosure can be applied to large size display panels, in particular to large-size AMOLED (organic light emitting diode) display panels.

Figure 7A:
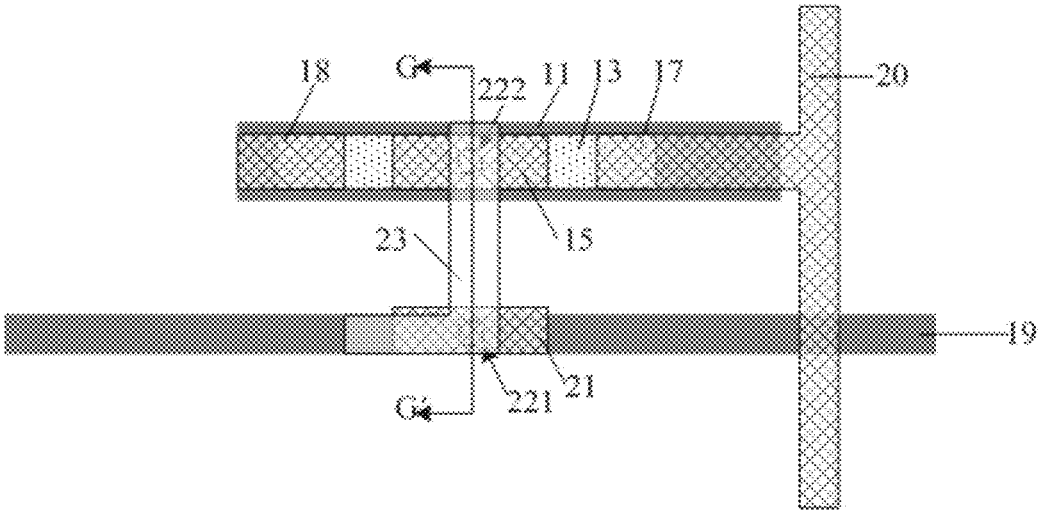
FIG. 7A is a top plan view showing the formation of a passivation layer and the patterned first electrode layer on the structure of FIG. 6A.
Figure 7B:
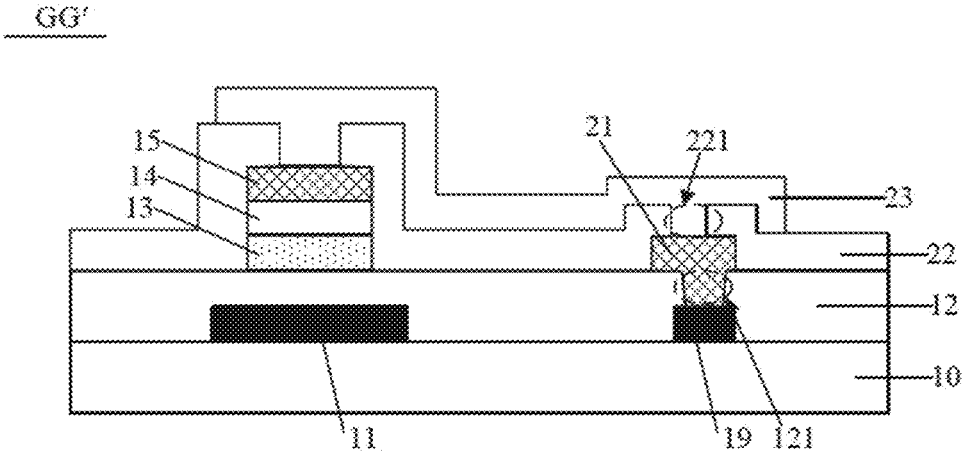
FIG. 7B is a section view of FIG. 7A in the GG' direction.

As shown in FIG. 7A and FIG. 7B. the method of manufacturing the array substrate further comprises forming a passivation layer 22 and a second electrode layer sequentially after forming the patterned first electrode layer. The passivation layer 22 comprises a third via-hole 221 and a fourth via-hole 222. The second electrode layer comprises a transparent conductive electrode and a second connecting electrode 23 on the passivation layer 22. Since the first connecting electrode 21 is exposed to the second connecting electrode 23 via the third via-hole 221 and the gate line 15 is exposed the second connecting electrode 23 via the fourth via-hole 222, the second electrode layer comprising the second connecting electrode 23 is electrically connected with the first connecting electrode 21 through the third via-hole 221 and electrically connected with the gate 15 through the fourth via-hole 222. As shown in FIG. 7B, the third via-hole 221 is above the second via-hole 121, i.e. adjacent to the second via-hole 121. Thus, the second electrode layer comprising the second connecting electrode 23 is connected to the gate line 19 through the second via-hole 121 and the third via-hole 221.

The second electrode layer may be made of transparent conductive materials, such as indium tin oxide (ITO) or indium oxide zinc (IZO), etc.

It should be noted that only the passivation layer 22 may be formed between the first connecting electrode 21 and the second connecting electrode 23. Thus, the third via-hole 221 for connecting the second connecting electrode 23 and the first connection electrode 21 may be formed just by etching through the passivation layer 22, thereby reducing the undesirable incidence of manufacturing the array substrate.

Accordingly, the second connecting electrode 23 may be formed simultaneously when the transparent conductive electrode is formed, thereby realizing the electrical connection of the gate 15 with the gate line 19 through the second connecting electrode 23 without increasing the number of patterning processes.

Further, when the array substrate is applied to the liquid crystal display panel, the transparent conductive electrode may be a pixel electrode. In this case, the transparent conductive electrode is electrically connected with the drain 18. Of course, it may also be a common electrode.

When the array substrate is applied to AMOLED (organic light emitting diode) display panels, the transparent conductive electrode may be an anode. In this case, the transparent conductive electrode is electrically connected with the drain 18.

Further, in the above S22 step, the oxide active layer 13 and the gate insulating layer 14 may be formed by means of a patterning process, comprising the following steps.

Figure 8A:
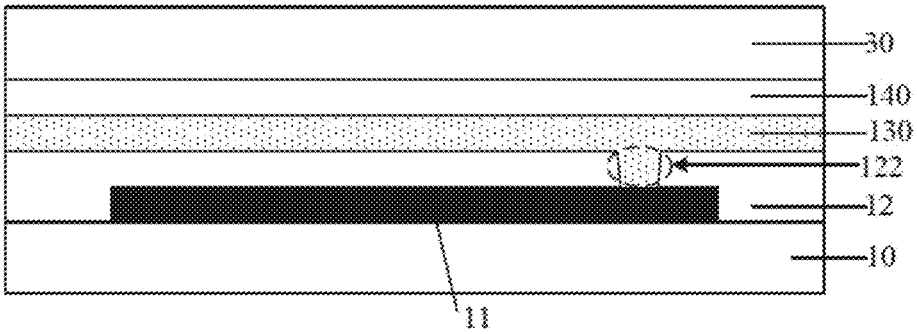
FIG. 8A is a schematic view illustrating a step in the process of preparing the oxide active layer and the gate insulating layer by a patterning process according to embodiments of present disclosure.

As shown in FIG. 8A, an oxide semiconductor film 130 and a gate insulating film 140 are formed sequentially on the substrate 10 having the buffer layer 12 formed thereon, and the photoresist 30 is formed on the gate insulating film 140.

In addition, the oxide semiconductor film 130 may comprise at least one or a combination of materials such as indium gallium zinc oxide (IGZO), indium zinc oxide (IZO), zinc oxide (ZnO) and gallium oxide zinc (GZO).

The gate insulating film 140 may comprise at least one or a combination of materials such as silicon nitride (SiNx), silicon oxide (SiOx), aluminium oxide ($Al_2O_3$), and aluminium nitride (AIN).

Figure 8B:
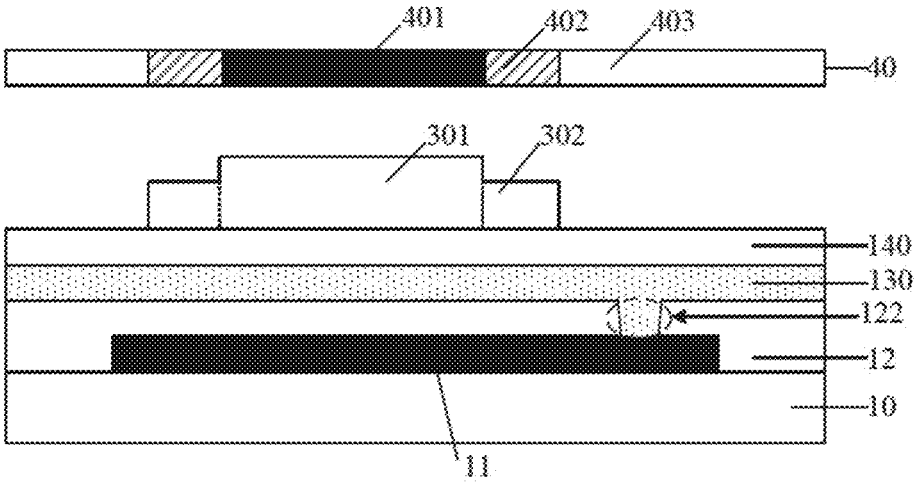
FIG. 8B is a schematic view illustrating a step in the process of preparing the oxide active layer and the gate insulating layer by a patterning process according to embodiments of present disclosure.

As shown in FIG. 8B, the exposure is performed on the photoresist 30 using a half tone mask 40, a photoresist fully-reserved portion 301, a photoresist half-reserved portion 302 and a photoresist fully-removed portion are formed after development; the photoresist fully-reserved portion 301 corresponds to the gate insulating layer 14 to be formed, the photoresist half-reserved portion 302 corresponds to the portion of the oxide active layer 13 to be formed that is not covered by the gate insulating layer 14: the photoresist fully-removed portion corresponds to other portions.

That is, the size of the gate insulating layer 14 to be formed is smaller than the oxide active layer 13 to be formed, and the projection of the gate insulating layer 14 to be formed on the substrate 10 is completely covered by the projection of oxide active layer 13 to be formed on the substrate 10.

The half tone mask 40 herein comprises a non-transparent portion 401, a half-transparent portion 402, and a transparent portion 403. After the exposure of the photoresist 30, the photoresist fully-reserved portion 301 corresponds to the non-transparent portion 401 of the half tone mask, the photoresist half-reserved portion 302 corresponds to the half-transparent portion 402 of the half tone mask, and the photoresist fully-removed portion corresponds to the transparent portion 403 of the half tone mask.

The photoresist 30 mentioned above is positive photoresist. When the photoresist 30 is negative photoresist, the photoresist fully-reserved portion 301 corresponds to the transparent portion 403 of the half tone mask, and the photoresist fully-removed portion corresponds to the non-transparent portion 401 of the half tone mask.

Figure 8C:
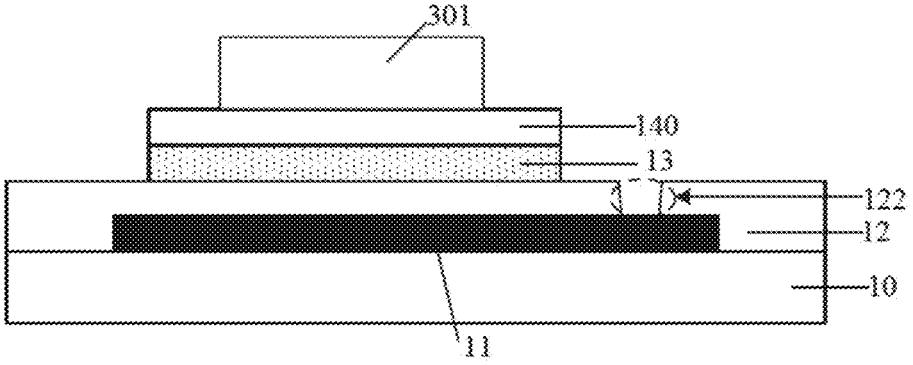
FIG. 8C is a schematic view illustrating a step in the process of preparing the oxide active layer and the gate insulating layer by a patterning process according to embodiments of present disclosure.

As shown in FIG. 8C, the gate insulating film 140 and the oxide semiconductor film 130 are etched separately by thy etching and wet etching process, wherein the gate insulating film and the oxide semiconductor film correspond to the photoresist fully-removed portion.

That is, a dry etching process is used to etch the gate insulating film 140 that is corresponding to the photoresist fully-removed portion, and then a wet etching process is used to etch the oxide semiconductor film 130 that is corresponding to the photoresist fully-removed portion.

It should be noted that FIG. 8C only illustrates that the first via-hole 122 is exposed after etching the gate insulating film 140 and the oxide semiconductor film 130 that are corresponding to the photoresist fully-removed portion. For the second via-hole 121, since the oxide active layer 13 and the gate insulating layer 14 are not formed above the gate line 19, the gate line 19 also corresponds to the photoresist fully-removed portion. Similarly, the second via-hole 121 is exposed after etching the gate insulating film 140 and the oxide semiconductor film 130 that are corresponding to the photoresist fully-removed portion.

As shown in FIG. 8C, the photoresist half-reserved portion 302 is removed by an ashing process.

Figure 8D:
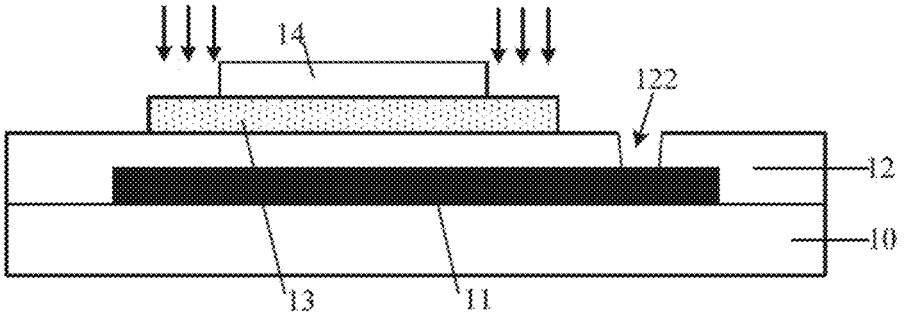
FIG. 8D is a schematic view illustrating a step in the process of preparing the oxide active layer and the gate insulating layer by a patterning process according to embodiments of present disclosure.

As shown in FIG. 8D, the exposed gate insulating films 140 is etched by dry etching process to form the gate insulating layer 14, and a portion of oxide active layer 13 beyond the gate insulating layer 14 is imparted properties of a conductor, i.e. treated to be conductive. The expression of "treated to be conductive" and "imparted properties of a conductor" is used inter-changeably in this disclosure.

The portion of oxide active layer 13 extends beyond the gate insulating layer 14, namely, the source and drain regions of the oxide active layer 13, is treated to be conductive, which provides an increase in its electrical conductivity, and a decrease in the ohmic contact resistance when the source 17 and the drain 18 contact with the oxide active layer 13, thus bringing a better switching characteristics to the thin film transistor.

Thereafter, the photoresist fully-reserved portion 301 may be removed to form a structure as shown in FIGS. 5 A and 5 (b).

It should be noted that since the oxide active layer 13 and the gate insulating layer 14 are formed by means of a patterning process, the orthographic projection of the gate insulating layer 14 on the substrate 10 is completely covered by the orthographic projection of oxide active layer 13 on the substrate 10.

In the embodiment of the disclosure, the gate insulating layer 14 and the oxide active layer 13 may be formed by using a half tone mask and performing the process of dry etching, wet etching, and then dry etching. Accordingly, because of the barrier of the photoresist fully-reserved portion 301 and the gate insulating layer 14, the exposed oxide active layer 13, namely, the source and drain regions, may be treated to be conductive to achieve the simplification of process.

Further, the light shielding layer 11 and the gate line 19 may be formed by one patterning process, and the buffer layer 12 may be formed by one patterning process. Thus, the backplate structure on the array substrate may be formed by four patterning processes. Namely, the light shielding layer 11 and the gate line 19 are formed by the first patterning process, the buffer layer 12 is formed by the second patterning process, the oxide active layer 13 and the gate insulating layer 14 are formed by the third patterning process, and the patterned first electrode layer comprising the gate 15, source 17, drain 18, data line 20 and first connection electrode 21, is formed by the fourth patterning process. Therefore, compared with other methods forming the patterned first electrode layer by five patterning processes, the number of the patterning processes is reduced according to embodiments of the present disclosure, thereby saving the cost.

Further, the means of being imparted properties of a conductor can be bombarding the portion of oxide active layer 13 beyond the gate insulating layer 14 with plasma to change the structure of the portion of oxide active layer 1, thereby increasing its electrical conductivity.

Some gases that form the plasma comprise a protective atmosphere or a reactive atmosphere. The protective atmosphere, for example, may be a gas or a mixture of nitrogen and argon, helium and neon. The reactive atmosphere, for example, may be a gas or a mixture of air, oxygen, hydrogen, ammonia and carbon dioxide.

Since plasma treatment may be carried out in a dry etching apparatus, a plasma treatment is performed on the portion of oxide active layer beyond the gate insulating layer to impart properties of a conductor to it by introducing corresponding gas in the same dry etching apparatus after etching the exposed gate insulating 140 by dry etching process. In this way, the manufacturing process may be further simplified.

Optionally, in the above S22 step. the patterned first electrode layer is formed by one patterning process. which may be prepared by the following steps.

Figure 9:
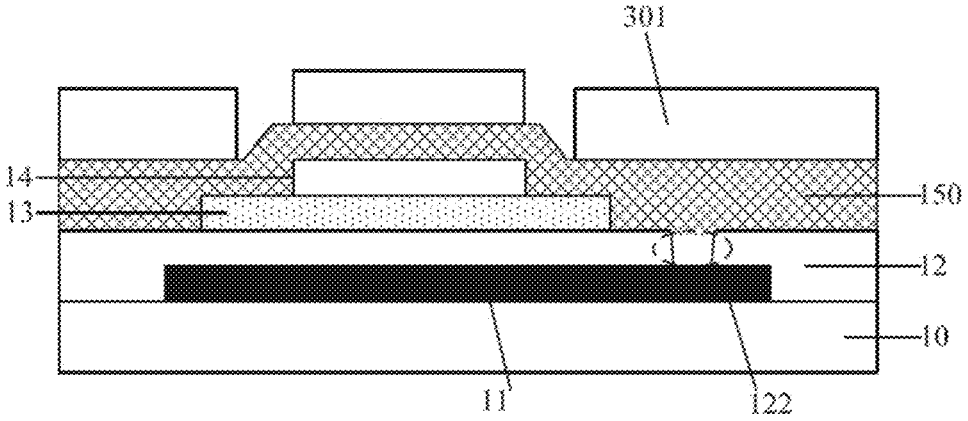
FIG. 9 is a schematic view illustrating the process of forming the patterned first electrode layer.

As shown in FIG. 9, a metal conductive film 150 is formed on the substrate having the oxide active layer 13 and the gate insulating layer 14 formed thereon and a layer of photoresist is formed, wherein the etching selectivity ratio of the metal conductive film to the oxide active layer 13 is greater than or equal to 10:1.

The material made up the metal conductive film 150 is not defined here, so long as it may be used as the gate 15, the source 17 and the drain 18, and the etching selectivity ratio of it to the oxide active layer 13 is greater than or equal to 10:1. Further, the metal conductive film 150 may be a single layer or a multilayer structure according to the metal conductive material.

As shown in FIG. 9, the exposure is performed on the layer of photoresist using a mask, and a photoresist fully-reserved portion 301 and a photoresist fully-removed portion are formed after development; wherein the photoresist fully-reserved portion 301 corresponds to the patterned first electrode layer to be formed, and the photoresist fully-removed portion corresponds to other portions.

As shown in FIG. 6B, the patterned first electrode layer, comprising the gate 15, the source 17, the drain 18, the first connecting electrode 21 and the data line 20 connected with the source, is formed by means of etching the metal conductive film that corresponds to the photoresist fully-removed portion by wet etching process.

When the patterned first electrode layer is formed by etching, the oxide active layer 13 is not affected significantly by using the metal conductive material in the embodiments of the disclosure, where the etching selectivity ratio of the metal conductive material to the material of oxide active layer 13 is greater.

Further, the material of the metal conductive film 150, that is, the patterned first electrode layer, may comprise pure copper.

The metal conductive film 150 herein may be a single layer structure. In this case, the metal conductive film 150 is a copper film.

Considering the diffusivity of copper, the metal conductive film 150 may be a multilayer structure. In this case, the metal conductive film 150 comprises a copper film layer and a metal barrier film layer that is located on a side or both sides of the copper film layer. The material of the metal barrier film layer may comprise at least one of molybdenum, molybdenum niobium alloy and titanium.

When the metal barrier film layer is located on a side of the copper film layer, the metal barrier film layer may be formed first, and the copper film layer is then formed. Alternatively, the copper film layer may be formed first, and then the metal barrier film layer is formed. When the metal barrier film layer is located on both sides of the copper film layer, the metal barrier film layer is formed first, followed by the formation of the copper film layer, and then the other metal barrier film layer is formed.

It should be noted that the order of forming the metal barrier film layer and the copper film layer may be determined according to the requirements of different products.

Further, when the oxide active layer 13 and the gate insulating layer 14 are formed by one patterning process, the orthographic projection of the gate 15 to be formed on the substrate 10 is completely covered by the orthographic projection of the gate insulating layer 14 on the substrate 10, and the size of the gate insulating layer 14 is greater than that of the gate 15 to be formed.

Figure 10A:
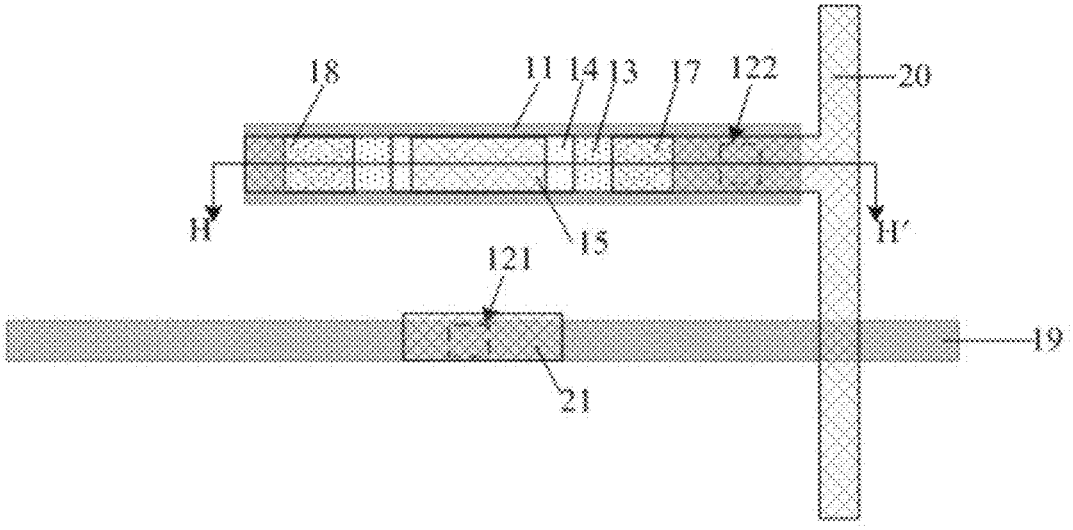
FIG. 10A is a schematic view illustrating a step in the process of forming the patterned first electrode layer on the gate insulating layer and removing the portion of the gate insulating layer exceeding a gate.
Figure 10B:
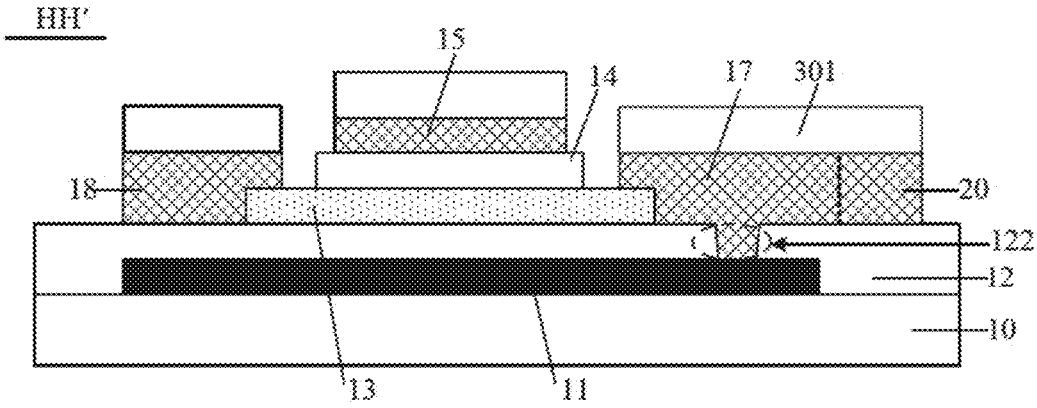
FIG. 10B is a schematic view illustrating a step in the process of forming the patterned first electrode layer on the gate insulating layer and removing the portion of the gate insulating layer exceeding a gate.
Figure 10C:
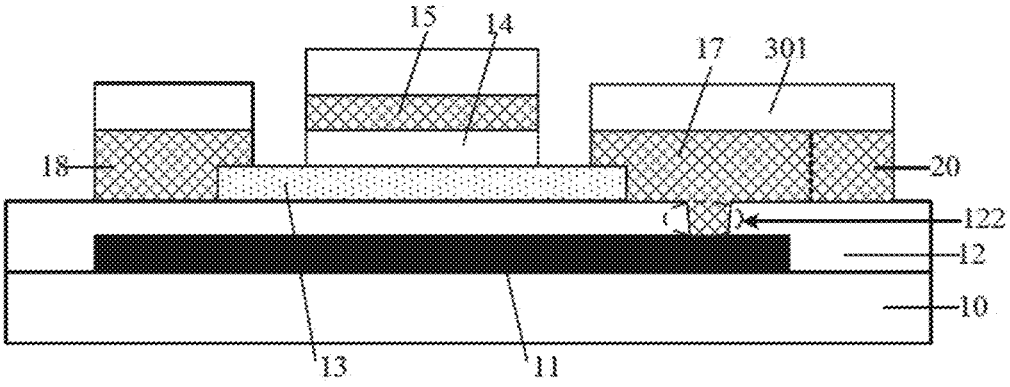
FIG. 10C is a schematic view illustrating a step in the process of forming the patterned first electrode layer on the gate insulating layer and removing the portion of the gate insulating layer exceeding a gate.

Accordingly, as shown in FIG. 10A~40B, after etching the metal conductive film 150 that corresponds to the photoresist fully-removed portion by wet etching process and before removing the photoresist fully-reserved portion 301, the method may further comprise etching the gate insulating layer 14 that is not covered by the photoresist fully-reserved portion 301 by dry etching process as shown in FIG. 10C.

In the embodiments of the disclosure, the orthographic projection of the gate 15 to be formed on the substrate 10 is completely covered by the orthographic projection of the gate insulating layer 14 on the substrate 10, and the size of the gate insulating layer 14 is greater than that of the gate 15 to be formed when the oxide active layer 13 and the gate insulating layer 14 is formed. After the patterned first electrode layer is formed, the gate insulating layer 14 that is not covered by the photoresist fully-reserved portion 301 is etched while the photoresist fully-reserved portion 301 is used as a barrier. Thus, the manufacturing process for forming the gate insulating layer 14 and gate 15 of thin film transistor may be simplified.

Figure 10D:
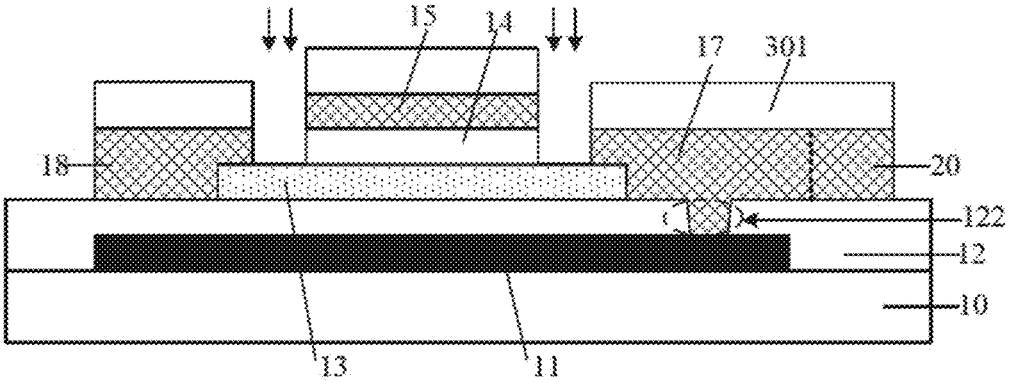
FIG. 10D is a schematic view illustrating the process of treating the exposed oxide active layer to be conductive.

Further, as shown in FIG. 10D, the step of etching the gate insulating layer 14 by dry etching process that is not covered by the photoresist fully-reserved portion 301 may comprise etching the gate insulating layer 14 that is not covered by the photoresist fully-reserved portion 301 by dry etching process and treating the exposed oxide active layer 13 with plasma to impart properties of a conductor to the exposed oxide active layer 13.

In the embodiments of the disclosure, the portion of the oxide active layer 13 that is not shielded by the gate 15, the gate insulating layer 14, the source 17 and the drain 18 is performed with plasma treatment to impart properties of a conductor to it. Thus, the switching characteristics of thin film transistors may be further improved. In addition, since plasma treatment may be carried out in a dry etching apparatus, after etching the gate insulating layer 14 that is not covered by the photoresist fully-reserved portion 301 by dry etching process, a plasma treatment is performed on the exposed oxide active layer 13 by introducing corresponding gas in the same dry etching apparatus. In this way, the manufacturing process may be further simplified.

Based on the above, in the S21 step, the buffer layer 12 may be formed by one patterning process, wherein the step of forming the second via-hole 121 and the first via-hole 122 may comprise forming the second via-hole 121 and the first via-hole 122 by dry etching process.

Because the dry etching has good anisotropy, which only has vertical etching without transverse erosion. using dry etching process in the formation of the second via-hole 121 and first via-hole 122, can accurately control the shape of the sidewall of via-holes and achieve superior etching uniformity.

As shown in FIG. 6A and FIG. 6B, an array substrate is provided according to the embodiments of the present disclosure, the array substrate comprising a substrate 10, and a light shielding layer 11, a buffer layer 12, an oxide active layer 13, a gate insulating layer 14 and a patterned first electrode layer that are sequentially arranged on the substrate.

A gate line 19 is disposed on the same layer with the light shielding layer 11; the orthographic projection of the oxide active layer 13 on the substrate 10 is covered by the orthographic projection of the light shielding layer 11 on the substrate 10.

The buffer layer 12 comprises a second via-hole 121 and a first via-hole 122; the gate line 19 is exposed to the first connecting electrode 21 via the second via-hole 121 and the light shielding layer 11 is exposed to the source 17 via the first via-hole 122.

The patterned first electrode layer may comprise a gate 15, a source 17, a drain 18, a first connecting electrode 21 and a data line 20 connected with the source 17: the first connecting electrode 21 is insulated from (i.e. not in direct connect with) the gate 15, the source 17, the drain 18 and the data line 20, and the first connecting electrode 21 is electrically connected with the gate line 19 through the second via-hole 121; the source 17 and the drain 18 are in direct contact with the oxide active layer 13, and the source 17 is also electrically connected with the light shielding layer 11 through the first via-hole 122. It should be noted that the light shielding layer 11, buffer layer 12, oxide active layer 13, gate insulating layer 14, gate 15, source 17 and drain 18 sequentially formed on the substrate 10 make up the oxide based thin film transistors with top-gate structure.

In addition, the source 17 is electrically connected with the light shielding layer 11 through the second via-hole 122. Namely, the first via-hole 122 corresponds to the portion of the source 17 which is not overlap with the oxide active layer 13.

According to embodiments of the present disclosure, an array substrate is provided. The array substrate may comprise the substrate 10, the light shielding layer 11 being of electrical conductive over the substrate 10, the buffer layer 12 over the light shielding layer 11, the active layer 13 insulated from the light shielding layer 11 by the buffer layer 12 and shielded by the light shielding layer 11 against light radiation. the gate insulating layer 14 over the active layer 13, and the patterned first electrode layer having the gate electrode 15 (i.e. a first electrode) over the gate insulating layer 12. The patterned first electrode layer further comprises the source electrode 17 (i.e. a second electrode) over the buffer layer 12, the source electrode 17 having at least a portion in contact with the buffer layer 12. The buffer layer 12 comprises the first via-hole 122 and the source electrode 17 is in electrical connection with the light shielding layer 11 through the first via-hole 122. The buffer layer 12 further comprises the second via-hole 121, and the gate line 19 is in electrical connection with the gate electrode 15 through the second via-hole 121. The patterned first electrode layer further comprises the drain electrode 18 (i.e. a third electrode). In addition, the gate line 19 may be formed at the same step of forming the light shielding layer 11.

Since only a buffer layer 12 is provided between the first connecting electrode 21 and the gate line 19, the first connecting electrode 21 and the gate line 19 may be electrically connected with each other only by the second via-hole 121 formed on the buffer layer 12. At the same time, since the source 17 and drain 18 are lapped directly with the oxide active layer 13, the first via-hole 122 corresponds to the portion of the source 17 that is not overlap with the oxide active layer 13, which leads to an electrical connection between the source 17 and the light shielding layer 11 only through the first via-hole 122 formed on the buffer layer 12. Accordingly, compared with other methods which need to etch through two layers, the occurrence of poor etching of via-holes can be reduced according to the embodiments of the present disclosure, thus reducing the undesirable incidence of manufacturing the array substrate. In addition, the array substrate prepared by the embodiments of the present disclosure may be applied to large size display panels, in particular to large-size AMOLED display panels.

Optionally, as shown in FIG. 7A and FIG. 7B, the array substrate may comprise a passivation layer 22 and a second electrode layer sequentially arranged on a side of the patterned first electrode layer 21 away from the substrate 10. The passivation layer 22 comprises a third via-hole 221 and a fourth via-hole 222. The second electrode layer comprises a transparent conductive electrode and a second connecting electrode 23 on the passivation layer 22. Since the first connecting electrode 21 is exposed to the second connecting electrode 23 via the third via-hole 221 and the gate line 15 is exposed the second connecting electrode 23 via the fourth via-hole 222. the second electrode layer comprising the second connecting electrode 23 is electrically connected with the first connecting electrode 21 through the third via-hole 221 and electrically connected with the gate 15 through the fourth via-hole 222. As shown in FIG. 7B, the third via-hole 221 is above the second via-hole 121, i.e. adjacent to the second via-hole 121. Thus, the second electrode layer comprising the second connecting electrode 23 is connected to the gate line 19 through the second via-hole 121 and the third via-hole 221.

It should be noted that only the passivation layer 23 may be formed between the first connecting electrode 21 and the second connecting electrode 22. Thus, the third via-hole 221 for connecting the second connecting electrode 23 and the first connection electrode 21 may be formed just by etching through the passivation layer 22, which can reduce the undesirable incidence of manufacturing the array substrate.

Accordingly, the second connecting electrode 23 may be formed simultaneously when the transparent conductive electrode is formed, thereby realizing the electrical connection of the gate 15 with the gate line 19 through the second connecting electrode 23, without increasing the number of patterning processes.

Further, when the array substrate is applied to the liquid crystal display panel, the transparent conductive electrode may be a pixel electrode. In this case, the transparent conductive electrode is electrically connected with the drain 18. Of course, it may also be a common electrode.

When the array substrate is applied to an AMOLED display panel, the transparent conductive electrode may be an anode. In this case, the transparent conductive electrode is electrically connected with the drain 18.

Optionally, the portion of oxide active layer 13 that is in contact with the source 17 and drain 18 is imparted properties of a conductor.

As mentioned above, when the oxide active layer 13 and the gate insulating layer 14 are formed by the same patterning process, the portion of oxide active layer 13 beyond the gate insulating layer 14 is imparted properties of a conductor.

In the embodiments of the disclosure, the portion of oxide active layer 13 that is in contact with the source 17 and the drain 18, is imparted properties of a conductor, which leads to an increase in its electrical conductivity, and a decrease in the ohmic contact resistance when the source 17 and the drain 18 are in contact with the oxide active layer 13, thus bringing a better switching characteristics to the thin film transistor.

The portion of the oxide active layer 13 not covered by the gate insulating layer 14 and the gate 15 may be imparted properties of a conductor.

As mentioned above, after etching the gate insulating layer 14 that is not covered by the photoresist fully-reserved portion 301 by dry etching process, as shown in FIG. 10D, the exposed oxide active layer 13 is treated with plasma to impart properties of a conductor to the exposed oxide active layer 13.

In the embodiments of the disclosure, the portion of the oxide active layer 13 that is not shielded by the gate 15, the gate insulating layer 14, the source 17 and the drain 18 is treated with plasma to impart properties of a conductor to it. Thus, the switching characteristics of thin film transistors may be further improved.

Optionally, the material of the patterned first electrode layer, may comprise pure copper.

The patterned first electrode layer herein may be a single layer structure. In this case, the patterned first electrode layer may be a copper film.

Considering the diffusivity of copper, the patterned first electrode layer may be a multilayer structure. In this case, the patterned first electrode layer may comprise a copper film layer and a metal barrier film layer that is located on a side or both sides of the copper film layer. The material of the metal barrier film layer may comprise at least one of molybdenum. molybdenum, niobium alloy and titanium.

When the metal barrier film layer is located on a side of the copper film layer, the metal barrier film layer may be formed first, and then the copper film layer is formed. Alternatively, the copper film layer may be formed first, and then the metal barrier film layer is formed. When the metal barrier film layer is located on both sides of the copper film layer, specifically, the metal barrier film layer is formed first, followed by the formation of the copper film layer, and then the metal barrier film layer is formed after the formation of the copper film layer.

It should be noted that the order of forming the metal barrier film layer and the copper film layer may be determined according to the requirements of different products.

Based on the above mentioned, the material of the oxide active layer 13 may comprise at least one of indium oxide gallium zinc, indium oxide zinc, zinc oxide, and gallium oxide.

For example, the material of the gate insulating layer 14 may comprise at least one of silicon nitride, silicon oxide, aluminium oxide and aluminum nitride.

The buffer layer 12 may be a single layer or multilayer structure. The buffer layer 12 provides a more stable bonding between the oxide active layer 13 and the substrate 10 and prevents harmful impurities and ions in the substrate 10 from spreading to the oxide active layer 13.

For example, when the buffer layer 12 is a single layer structure, the buffer layer 12 may be made of materials such as silicon oxide (SiOx) or silicon nitride (SiNx). When the buffer layer 12 has two or more layers, it may be a composite film of the silicon oxide layer and the silicon nitride layer.

According to the embodiments of the present disclosure, a display panel comprising the array substrate is provided. Since only a buffer layer is provided between the first connecting electrode and the gate line, the first connecting electrode and the gate line may be electrically connected with each other only by the second via-hole formed on the buffer layer. At the same time, since the source and drain are lapped directly with the oxide active layer, the first via-hole corresponds to the portion of the source that is not overlap with the oxide active layer. which leads to an electrical connection between the source and the light shielding layer only through the first via-hole formed on the buffer layer. Accordingly, compared with other methods which need to etch through two layers, the occurrence of poor etching of via-holes is reduced according to the embodiments of the present disclosure, thus reducing the undesirable incidence of manufacturing the array substrate.

The display panel may be a liquid crystal display panel or an OLED display panel.

According to the embodiments of the present disclosure, a display device comprising the display panel is provided, the display panel comprising the array substrate. Since only a buffer layer is provided between the first connecting electrode and the gate line, the first connecting electrode and the gate line may be electrically connected with each other only by the second via-hole formed on the buffer layer. At the same time, since the source and drain are lapped directly with the oxide active layer, the first via-hole corresponds to the portion of the source that is not overlap with the oxide active layer, which leads to an electrical connection between the source and the light shielding layer only through the first via-hole formed on the buffer layer. Accordingly, compared with other methods which need to etch through two layers, the occurrence of poor etching of via-holes is reduced according to the embodiments of the present disclosure, thus reducing the undesirable incidence of manufacturing the array substrate. In addition, the array substrate may be applied to large size display panels, in particular to large-size AMOLED display panels.

Although the present disclosure has been specifically described on the basis of the exemplary embodiments thereof, the disclosure is not to be construed as being limited thereto. Various changes or replacements which may be made to the embodiments by those skilled in the art shall be covered within the scope of the present disclosure.

What is claimed is:

1. An array substrate comprising:

a substrate;

a light shielding layer being of electrical conductive over the substrate;

a buffer layer over the light shielding layer;

an active layer insulated from the light shielding layer by the buffer layer and shielded by the light shielding layer against light radiation;

a gate insulating layer disposed over the active layer;

a gate line in a same layer with the light shielding layer; and a patterned first electrode layer having a first electrode over the gate insulating layer, the first electrode being a gate electrode; wherein the patterned first electrode layer further comprises a second electrode over the buffer layer, the second electrode having at least a portion in contact with the buffer layer, wherein the buffer layer comprises a first via-hole, and the second electrode is in electrical connection with the light shielding layer through the first via-hole.

2. The array substrate as claimed in claim 1, wherein the buffer layer further comprises a second via-hole, and the gate line is in electrical connection with the gate electrode through the second via-hole.

3. The array substrate as claimed in claim 1, wherein the second electrode is a source electrode.

4. The array substrate as claimed in claim 3, wherein the patterned first electrode layer further comprises a third electrode which is a drain electrode.

5. The array substrate as claimed in claim 2, wherein the array substrate further comprises a passivation layer and a second electrode layer overthe patterned first electrode layer;

the passivation layer comprises a third via-hole adjacent to the second via-hole, and a fourth via-hole through which the second electrode layer is connected to the gate electrode; and the second electrode layer is connected to the gate line through the second via-hole and the third via-hole.

6. The array substrate as claimed in claim 5, wherein the second electrode layer comprises a transparent electrode, the transparent conductive electrode comprising one or a combination selected from a group consisting of: a pixel electrode, a common electrode and an anode.

7. The array substrate as claimed in claim 5, further comprising a first connecting electrode connected to the gate line through the second via-hole, and a second connecting electrode connected to the first connecting electrode through the third via-hole and connected to the gate electrode through the fourth via-hole.

8. The array substrate as claimed in claim 1, wherein the active layer includes a first portion in contact with the second electrode, the first portion being treated to be conductive.

9. The array substrate as claimed in claim 8, wherein the active layer further includes a second portion not covered by the gate insulating layer or the second electrode, the second portion being treated to be conductive.

10. The array substrate as claimed in claim 1, wherein the active layer comprises at least one or a combination of materials selected from a group consisting of: indium gallium zinc oxide, indium zinc oxide, zinc oxide and gallium oxide zinc.

11. A display panel, wherein the display panel comprises the array substrate as claimed in claim 1.

12. A method of manufacturing an array substrate comprising:

forming a light shielding layer of electrical conductive material over a substrate;

forming a buffer layer over the substrate having the light shielding layer formed thereon;

forming an active layer and a gate insulating layer sequentially over the buffer layer, the active layer being insulated from the light shielding layer by the buffer layer and shielded by the light shielding layer against light radiation;

forming a gate line in a same layer with the light shielding layer; and forming a patterned first electrode layer having a first electrode over the gate insulating layer, the first electrode being a gate electrode; wherein the patterned first electrode layer further comprises a second electrode over the buffer layer, the second electrode having at least a portion in contact with the buffer layer;

wherein the buffer layer comprises a first via-hole, the second electrode is in electrical connection with the light shielding layer through the first via-hole.

13. The method as claimed in claim 12, wherein the buffer layer further comprises a second via-hole, and the gate line is in electrical connection with the gate electrode through the second via-hole.

14. A method of manufacturing an array substrate comprising:

forming a light shielding layer of electrical conductive material over a substrate;

forming a buffer layer over the substrate having the light shielding layer formed thereon;

forming an active layer and a gate insulating layer sequentially over the buffer layer, the active layer being insulated from the light shielding layer by the buffer layer and shielded by the light shielding layer against light radiation; and forming a patterned first electrode layer having a first electrode over the gate insulating layer, the first electrode being a gate electrode; wherein the patterned first electrode layer further comprises a second electrode over the buffer layer, the second electrode having at least a portion in contact with the buffer layer;

wherein the buffer layer comprises a first via-hole, the second electrode is in electrical connection with the light shielding layer through the first via-hole;

wherein the step [offorming] *of forming* the active layer and the gate insulating layer comprises:

sequentially forming a semiconductor film and a gate insulating film, and forming *a* photoresist on the gate insulating film;

subjecting the photoresist to exposure using a half tone mask, thereby forming a photoresist fully-reserved portion, a photoresist half-reserved portion and a photoresist fully-removed portion after development;

wherein the photoresist fully-reserved portion [corresponding] *corresponds* to the gate insulating layer to be formed, the photoresist half-reserved portion [corresponding] *corresponds* to a portion of the active layer to be formed that is not covered by the gate insulating layer; the photoresist fully-removed portion [corresponding] *corresponds* to other portions;

etching the gate insulating film and the semiconductor film that are correspond to the photoresist fully-removed portion by dry etching and wet etching process;

removing the photoresist half-reserved portion by ashing process;

etching the exposed gate insulating film by dry etching process to form the gate insulating layer; and treating the portion of active [layerthat] *layer that* is not covered by the gate insulating layer to be conductive with plasma.

15. The method as claimed in claim 12, wherein the step of forming the patterned first electrode layer comprises:

forming a metal conductive film on the substrate having the active layer and the gate insulating layer formed thereon;

forming a photoresist layer, wherein etching selectivity ratio of the metal conductive film to the active layer is greater than or equal to 10:1;

subjecting the photoresist layer to exposure using a mask, thereby forming a photoresist fully-reserved portion and a photoresist fully-removed portion after development; and etching the metal conductive film by wet etching process to form the patterned first electrode layer.

16. The method as claimed in claim 15, wherein prior to the forming of the patterned first electrode layer, the orthographic projection of the gate electrode to be formed on the substrate is completely covered by the orthographic projection of the gate insulating layer on the substrate, and the size of the gate insulating layer is greater than that of the gate electrode to be formed;

wherein the method further comprises etching the gate insulating layer by dry etching process after etching the metal conductive film by wet etching process and before removing the photoresist fully-reserved portion.

17. The method as claimed in claim 16, wherein etching of the gate insulating layer exposes a second portion of the active layer;

wherein the method further comprises treating the second portion of the active layer to be conductive with plasma.

18. The method as claimed in claim 13, wherein the first via-hole and the second via-hole are formed by dry etching process.

*19. The array substrate as claimed in claim 1, wherein the patterned first electrode layer further comprises a third electrode which is a drain electrode, the second electrode is a source electrode;*

*the active layer includes a first portion in contact with the second electrode, the first portion being treated to be conductive; and*

*the active layer further includes a second portion not covered by the gate insulating layer and/or the second electrode, the second portion being treated to be conductive.*

*20. The array substrate as claimed in claim 1, wherein the buffer layer further comprises a second via-hole, and the gate line is in electrical connection with the patterned first electrode layer through the second via-hole;*

*the array substrate further comprises a passivation layer and a second electrode layer over the patterned first electrode layer;*

*the passivation layer comprises a fourth via-hole through which the second electrode layer is connected to the patterned first electrode layer; and*

*the gate line and the light shielding layer have a same material.*

* * * * *